US012690450B2

(12) United States Patent
Chen

(10) Patent No.: US 12,690,450 B2
(45) Date of Patent: Jul. 21, 2026

(54) SEMICONDUCTOR DEVICE AND FABRICATING METHOD THEREOF

(71) Applicant: Fujian Jinhua Integrated Circuit Co., Ltd., Quanzhou City (CN)

(72) Inventor: Min-Teng Chen, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 393 days.

(21) Appl. No.: 18/213,881

(22) Filed: Jun. 25, 2023

(65) Prior Publication Data

US 2024/0194594 A1 Jun. 13, 2024

(30) Foreign Application Priority Data

Dec. 9, 2022 (CN) .......................... 202211584613.5
Dec. 9, 2022 (CN) .......................... 202223307561.5

(51) Int. Cl.
*H10W 20/41* (2026.01)
*H10W 20/00* (2026.01)

(52) U.S. Cl.
CPC ....... *H10W 20/435* (2026.01); *H10W 20/056* (2026.01); *H10W 20/082* (2026.01)

(58) Field of Classification Search
CPC ........... H01L 23/5283; H01L 21/76804; H01L 21/76877; H10B 43/27; H10B 43/20–50; H10W 20/435; H10W 20/056; H10W 20/082
See application file for complete search history.

(56) References Cited

U.S. PATENT DOCUMENTS

| 11,276,706 B2 | 3/2022 | Lim et al. | |
| 11,569,344 B2 | 1/2023 | Kang et al. | |
| 2008/0284006 A1* | 11/2008 | Hong | ............... H01L 23/53238 |
| | | | 257/734 |
| 2019/0252403 A1 | 8/2019 | Kaminaga | |

\* cited by examiner

*Primary Examiner* — Thanhha S Pham
(74) *Attorney, Agent, or Firm* — Winston Hsu

(57) ABSTRACT

The present disclosure provides a semiconductor device and a fabricating method thereof, and the semiconductor device includes a substrate, a plurality of conductive pads, and a plurality of conductive columns. The conductive pads are separately disposed in a first insulating layer, over the substrate. The conductive columns are separately disposed in a second insulating layer, individually contacting each of the conductive pads. The second insulating layer includes a first dielectric layer, a second dielectric layer and a third dielectric layer stacked on sidewalls of the conductive columns, wherein the second dielectric layer physically contacts the first dielectric layer, the conductive pads and the third dielectric layer at the same time. The second insulating layer is allowable to avoid the short-circuit issue caused by excessively lateral etching, thereby improving the structural reliability and the performances.

15 Claims, 8 Drawing Sheets

SEMICONDUCTOR DEVICE AND FABRICATING METHOD THEREOF

BACKGROUND OF THE INVENTION

1. Field of the Invention

The present disclosure relates to a semiconductor device, and more particularly, to a three-dimensional memory device and a fabricating method thereof.

2. Description of the Prior Art

Memory devices are indispensable and important parts in modern electronic products. In addition to memorize the user's data, the memory devices are also responsible for memorizing the program code executed by the central processing unit and the information that needs to be temporarily saved during the operation. Semiconductor memory devices may be classified into volatile memory devices and non-volatile memory devices. Data stored in a volatile memory device such as a dynamic random access memory (DRAM) or a static random access memory (SRAM) is erased when the volatile memory device is out of power supply, and must be re-entered at the next power supply. Data stored in a non-volatile memory device such as a read-only memory (ROM) or a flash memory is still kept in the non-volatile memory device when the power is turned off, so that the data may be directly read after the power is supplied again.

NAND flash memory is the most widely used non-volatile memory with the advantages of small size, low power consumption, fast operation speed and low manufacturing cost. As the semiconductor manufacturing technology continues to progress, a three-dimensional (3D) NAND flash memory has been developed to obtain a higher cell density to meet the demand for a higher storage capacity. However, due to the number of the stack layers of the memory stack structure has continuously increased, the related fabricating processes, as well as the device structures, have to be further improved to maintain a better device performance under a simplified process flow.

SUMMARY OF THE INVENTION

One of the objectives of the present disclosure provides a semiconductor device where a composite second insulating layer is additionally disposed in the semiconductor device, to effectively avoid the possible short circuit issue caused by excessively lateral etching. Thus, the reliability and device performances of the semiconductor device are both improved thereby.

One of the objectives of the present disclosure provides a fabricating method of a semiconductor device, in which a second insulating layer is additionally formed between a stack layer and a conductive pad, with the formation of the second insulating layer sufficiently preventing from the possible short circuit issue caused by excessively lateral etching while forming the through holes. Thus, the semiconductor device obtained accordingly will therefore gain better reliability and device performance.

To achieve the purpose described above, one embodiment of the present disclosure provides a semiconductor device including a substrate, a plurality of conductive pads, and a plurality of conductive columns. The conductive pads are separately disposed in a first insulating layer, over the substrate. The conductive columns are separately disposed in a second insulating layer, individually contacting each of the conductive pads. The second insulating layer includes a first dielectric layer, a second dielectric layer and a third dielectric layer stacked on sidewalls of the conductive columns, wherein the second dielectric layer physically contacts the first dielectric layer, the conductive pads and the third dielectric layer at the same time.

To achieve the purpose described above, one embodiment of the present disclosure provides a fabricating method of a semiconductor device including the following steps. Firstly, a substrate is provided, and a plurality of conductive pads is formed over the substrate, with the conductive pads being separately disposed in a first insulating layer. Then, a plurality of conductive columns is formed on the substrate, with the conductive columns being separately disposed in a second insulating layer. The conductive columns respectively contact each of the conductive pads, and the second insulating layer includes a first dielectric layer, a second dielectric layer and a third dielectric layer stacked on sidewalls of the conductive columns, wherein the first dielectric layer physically contacts the second dielectric layer and the third dielectric layer at the same time.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1 to FIG. 10 are schematic diagrams illustrating a semiconductor device according to a first embodiment in the present disclosure, wherein:

FIG. 1 shows a schematic cross-sectional view of a semiconductor device after forming a metal-oxide material layer;

FIG. 2 shows a schematic cross-sectional view of a semiconductor device after performing a patterning process;

FIG. 3 shows a schematic cross-sectional view of a semiconductor device after performing a first treatment process;

FIG. 4 shows a schematic cross-sectional view of a semiconductor device after performing a second treatment process;

FIG. 5 shows a schematic cross-sectional view of a semiconductor device after forming a stack layer;

FIG. 6 shows a schematic cross-sectional view of a semiconductor device after performing a first etching process;

FIG. 7 shows a schematic cross-sectional view of a semiconductor device after performing a second etching process;

FIG. 8 shows a schematic cross-sectional view of a semiconductor device after forming a mask layer;

FIG. 9 shows a schematic cross-sectional view of a semiconductor device after forming through holes; and FIG. 10 shows a schematic cross-sectional view of a semiconductor device after forming conductive columns.

FIG. 11 to FIG. 12 are schematic diagrams illustrating a semiconductor device according to a second embodiment in the present disclosure, wherein:

FIG. schematic cross-sectional view of semiconductor device after forming through holes; and FIG. 12 shows a schematic cross-sectional view of a semiconductor device after forming conductive columns.

FIG. 13 to FIG. 14 are schematic diagrams illustrating a semiconductor device according to a third embodiment in the present disclosure, wherein:

FIG. 13 shows a schematic cross-sectional view of a semiconductor device after forming through holes; and FIG. 14 shows a schematic cross-sectional view of a semiconductor device after forming conductive columns.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
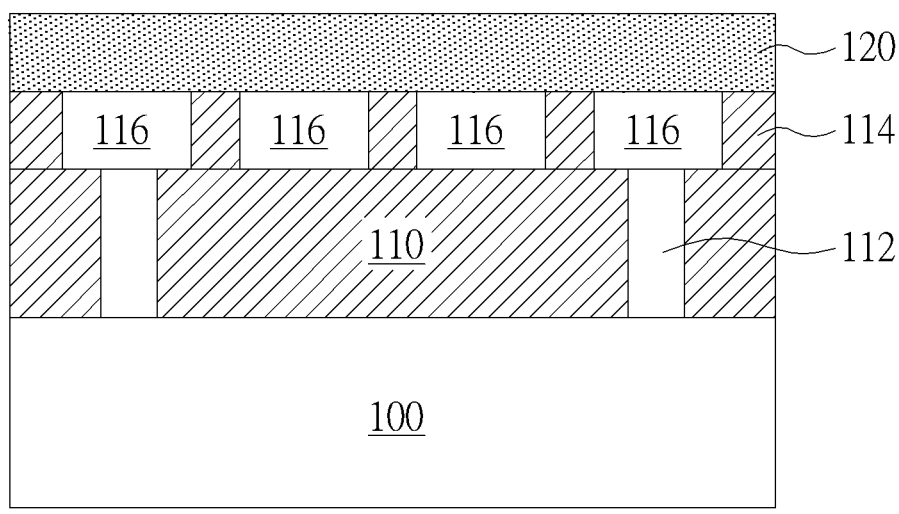

Please refer to FIG. 1 to FIG. 10, which are schematic diagrams of a semiconductor device 200 according to the first embodiment in the present disclosure. Firstly, please refers to FIG. 1, a substrate 100 is provided, the substrate 100 for example includes a silicon substrate, a silicon containing substrate, an epitaxial silicon substrate, a silicon-on-insulator (SOI) substrate, or a substrate having other suitable materials. Then, a plurality of plugs 112 is formed over the substrate 100, within an isolating layer 110 disposed on the substrate 100, wherein the isolating layer 110 for example includes an isolating material like silicon dioxide (SiO$_2$) or silicon oxynitride (SiON), and the plugs 112 for example includes a conductive material like aluminum (Al), titanium (Ti), tantalum (Ta), tungsten (W) or copper (Cu), and preferably includes tungsten, but not limited thereto. In one embodiment, other films (not shown in the drawings) may also be formed additionally between the substrate 100 and the isolating layer 110, but not limited thereto. Also, the specific number of the plugs 112 may be further adjusted based on practical requirements of the present disclosure, and which is not limited to be what is shown in FIG. 1.

Then, a plurality of conductive pads 116 is formed on the substrate 100, with each of the conductive pads 116 being separately disposed in a first insulating layer 114 to contact to each of the plugs 112 underneath. The first insulating layer 114 for example includes an isolating material like silicon dioxide or silicon oxynitride, and preferably includes the same material as the isolating layer 110. The conductive pad 116 also includes a conductive material, such as aluminum, titanium, tantalum, tungsten or copper, and preferably includes tungsten, but not limited thereto. In one embodiment the formation of the conductive pads 116 includes but not limited to the following steps. Firstly, an insulating material layer (not shown in the drawings) is formed on the isolating layer 110, a plurality of grooves (not shown in the drawings) is formed in the insulating material layer through a mask layer (not shown in the drawings), to respectively expose each of the plugs 112 underneath, a conductive material is filled in the grooves, and the mask layer is completely removed after partially removing the mask layer through a planarization process. Accordingly, the first insulating layer 114 is formed on the substrate 100, and the conductive pad 116 is formed simultaneously within the first insulating layer 114.

Please further refers to FIG. 1, a metal-oxide material layer 120 is formed on the substrate 110, to entirely cover on the first insulating layer 114 and the conductive pads 116. It is noted that, the metal-oxide material layer 120 for example includes a material having a significant etching selectivity relative to the first insulating layer 114, for example including aluminum oxide (Al$_2$O$_3$), titanium oxide, tantalum oxide, tungsten oxide, or copper oxide, and preferably including aluminum oxide, but no limited thereto.

Figure 2:
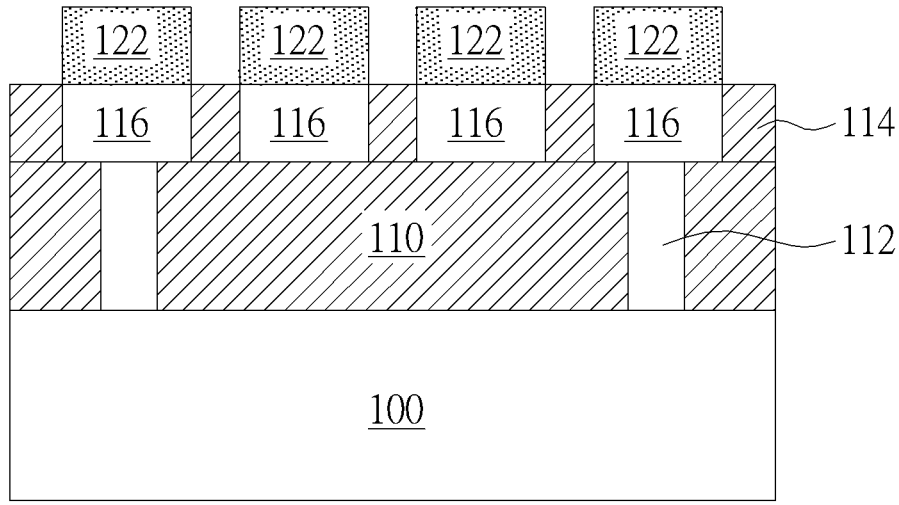

As shown in FIG. 2, a patterning process is performed through another mask layer (not shown in the drawings) to pattern the metal-oxide material layer 120 into a plurality of metal-oxide patterns 122, and then, the another mask pattern is completely removed. Precisely speaking, each of the metal-oxide patterns 122 is separately disposed on each of the conductive pads 116 to align with each of the conductive pads 116 and to expose the first insulating layer 114 underneath.

Figure 3:
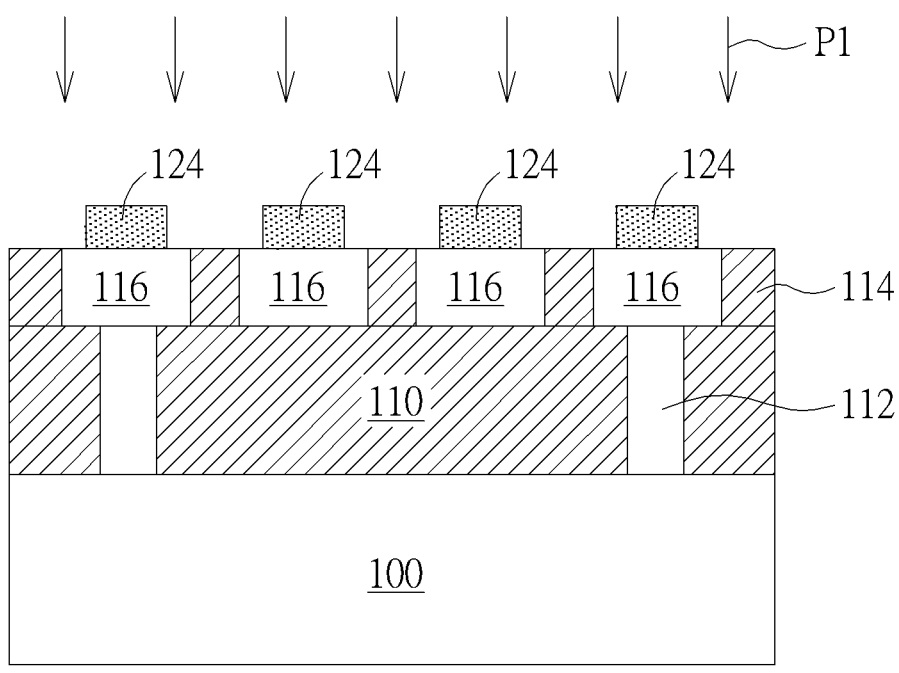

As shown in FIG. 3, a treatment process P1 such as a wet etching process is performed to thin down the overall size (for example including a length and/or a thickness) of each of the metal-oxide patterns, to form a plurality of metal-oxide patterns 124 with a smaller size, thereby partially exposing each of the conductive pads 116 from each metal-oxide pattern 124. Accordingly, the size such as the length of each of the conductive pads 116 being exposed from each metal-oxide pattern 124 will be effectively controlled, but not limited thereto.

Figure 4:
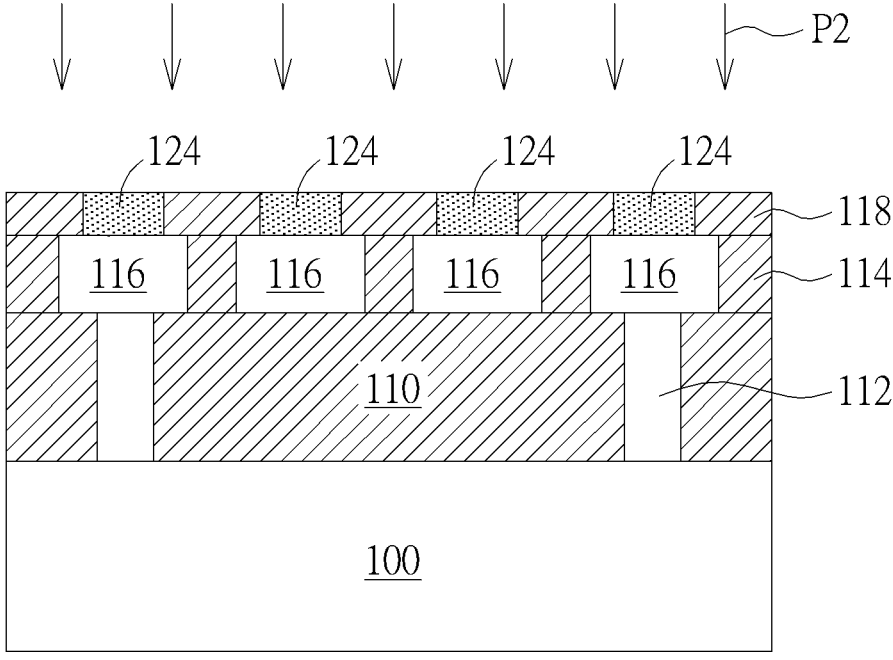

As shown in FIG. 4, a dielectric layer 118 is formed on the substrate 100, to cover sidewalls of each metal-oxide pattern 124. The dielectric layer 118 for example includes an isolating material like silicon oxide or silicon oxynitride, and preferably includes a material the same as that of the first insulating layer 114, but not limited thereto. In one embodiment, the formation of the dielectric layer 118 includes but not limited to the following steps. Firstly, a dielectric material layer (not shown in the drawing) is formed to cover the metal-oxide patterns 124, and the conductive pads 116 and the first insulating layer 114 underneath, and the dielectric layer 118 is formed to have a coplanar top surface with the metal-oxide patterns 124 after performing a planarization process. Then, a treatment process P2 such as a thermal oxidation process is performed by introducing heat and oxygen, so that, the texture of each of the metal-oxide patterns 124 is transformed into a harder and denser structure instead of changing the material thereof. Accordingly, each of the metal-oxide patterns 124 will obtain a significant etching selectivity relative to the dielectric layer 118 at two sides thereof during the following etching process for example including a wet etching process or a dry etching process.

Figure 5:
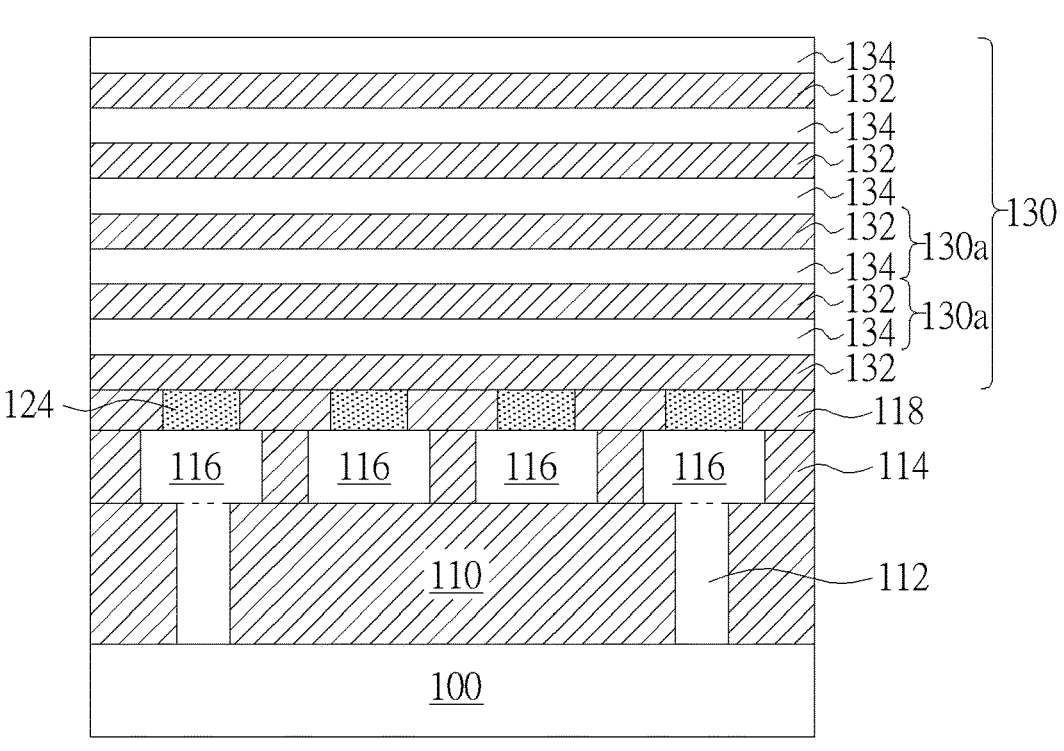

As shown in FIG. 5, a stack layer structure 130 including at least one stack layer is formed on the metal-oxide patterns 124 and the dielectric layer 118. In the present embodiment, the stack layer structure 130 includes a plurality of dielectric layers 132 and a plurality of conductive layers 134 alternately stacked with each other, with any one of the conductive layers 134 and the dielectric layer 132 disposed thereon being together configured as a conductive-dielectric pair 130a. The precise number of the conductive-dielectric pair 130a may be adjustable based on the practical requirements of the present disclosure, and which is not limited to be what is shown in FIG. 5. The conductive layer 134 for example includes a conductive material such as a metal or nonmetal conductive material like aluminum, titanium, tantalum, tungsten, copper, titanium nitride (TiN), titanium carbide (TiC), tantalum nitride (TaN), titanium tungsten (Ti/W), titanium/titanium nitride (Ti/TiN), polysilicon, doped silicon, silicide or a combination thereof, and preferably includes tungsten. The dielectric layer 132 for example includes the same dielectric material, such as silicon oxide, silicon nitride, silicon oxynitride or a combination thereof, and preferably includes a dielectric material the same as that of the first insulating layer 114 and/or the dielectric layer 118, but not limited thereto.

Figure 6:
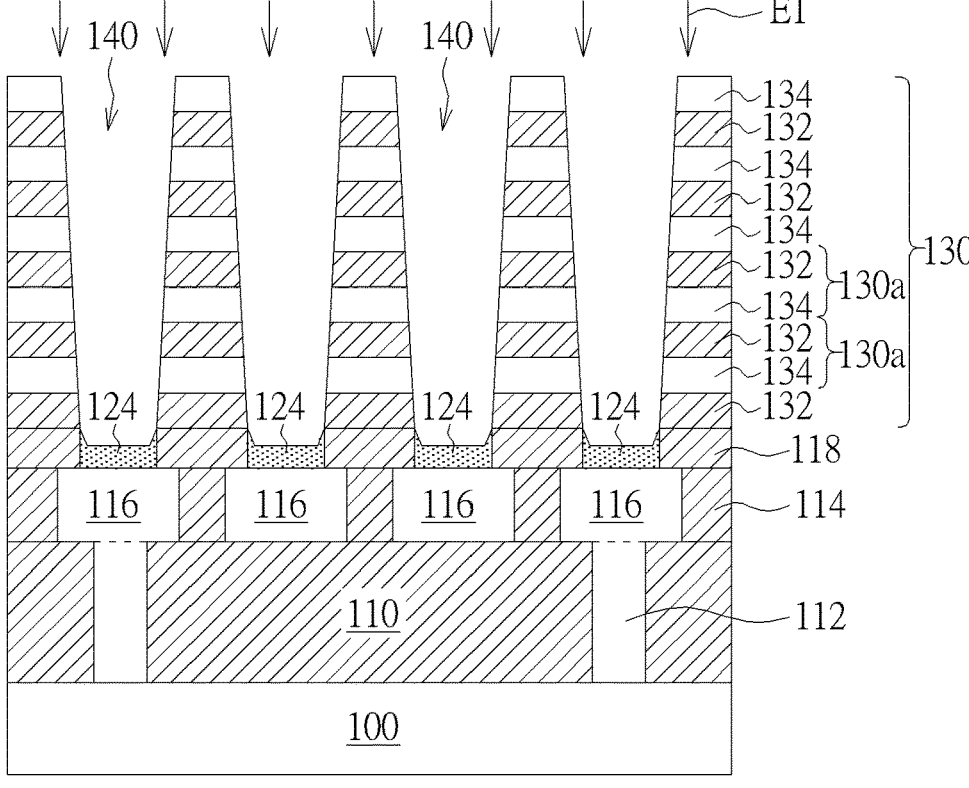

As shown in FIG. 6, an etching process E1 such as a dry etching process is performed through another mask layer (not shown in the drawings), to form a plurality through holes 140 in the stack layer structure 130. Precisely speaking, through the dry etching process, each of the dielectric layers 132, each of the conductive layers 134 and a portion of the metal-oxide pattern 124 are etched vertically, to form the through holes 140 penetrating through the stack layer structure 130 and the portion of each metal-oxide pattern 124, thereby exposing a surface of each metal-oxide pattern 124 being lower than the top surface of the dielectric layer 118.

Figure 7:
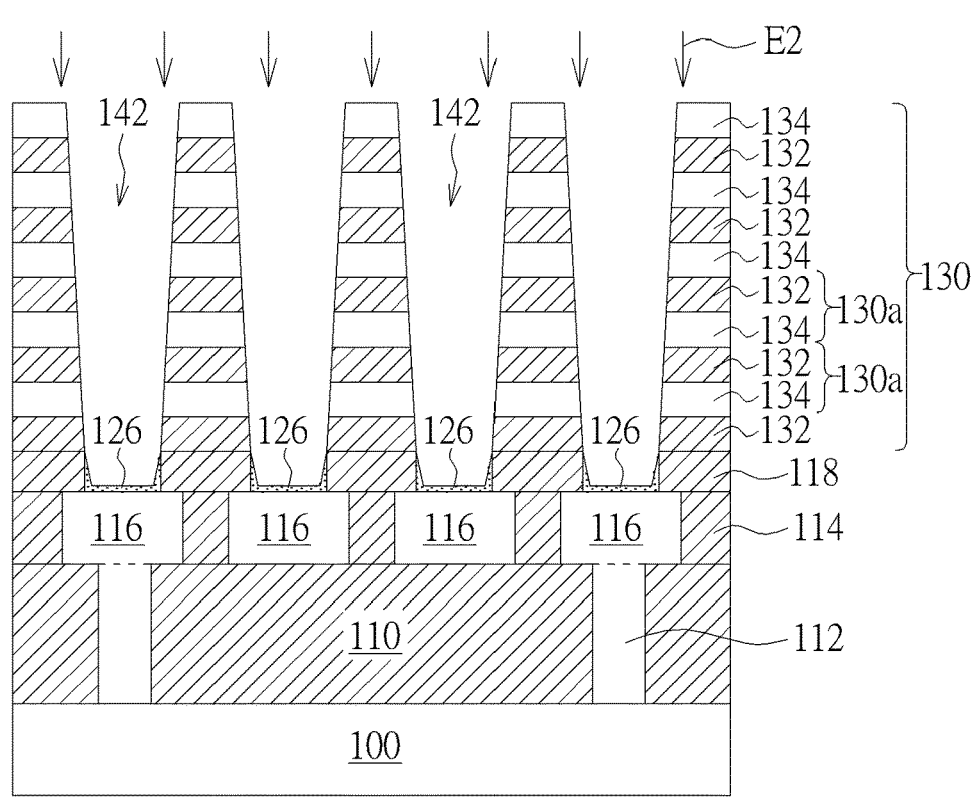

As shown in FIG. 7, an etching process E2 such as a wet etching process is performed through another mask layer (not shown in the drawings), to further etch the metal-oxide patterns 124, thereby forming a plurality of through holes 142 and a plurality of metal-oxide patterns 126. Precisely speaking, through the etching process E2, each of the metal-oxide patterns 124 is etched both along a vertical direction and a lateral direction via each of the through holes 140 shown in FIG. 6, to further thin down the thickness of each metal-oxide pattern 124 in an overall manner. Accordingly, each of the metal-oxide patterns 126 will therefore obtain a U-shaped cross-section, disposed at the bottom of each of the through holes 142. Then, the another mask layer is completely removed.

Figure 8:
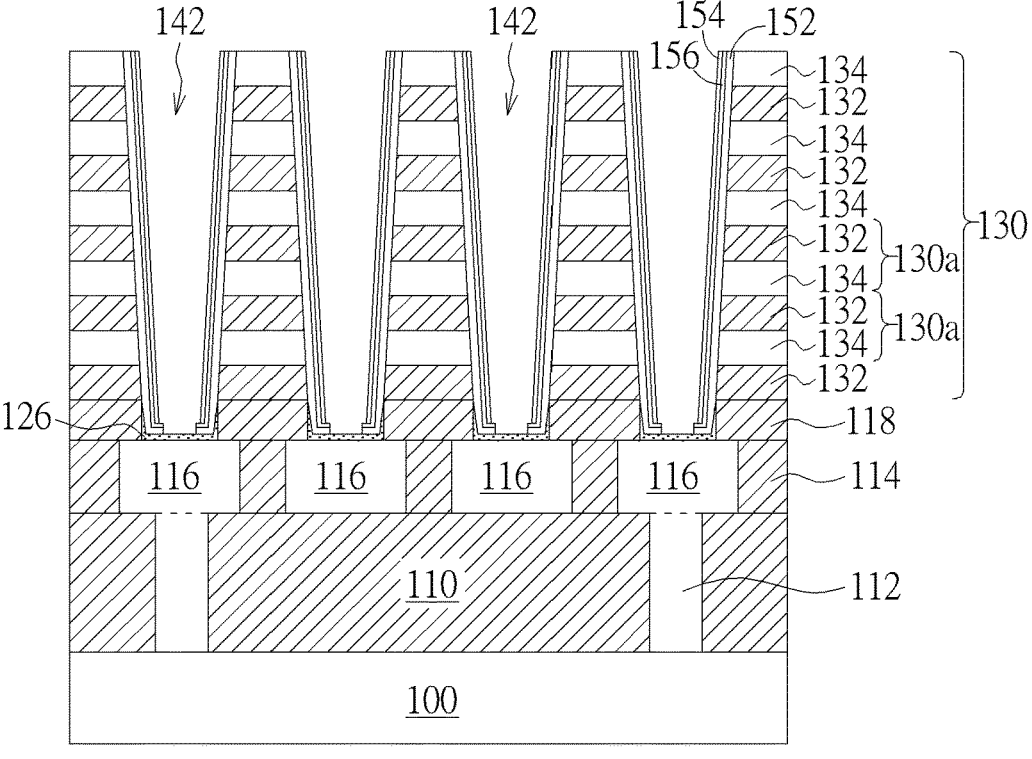

As shown in FIG. 8, a dielectric layer 152, a barrier layer 154, and a mask layer 156 are sequentially formed on two opposite sidewalls of each of the through holes 142. The dielectric layer 152 for example includes a high-k dielectric material such as hafnium oxide (HfO$_2$), hafnium m silicon oxide (HfSiO$_4$), hafnium silicon oxynitride (HfSiON), zinc oxide (ZrO$_2$), titanium oxide (TiO$_2$) or a combination thereof, the barrier layer 154 for example includes titanium, tantalum, titanium nitride, or tantalum nitride, and the mask layer 156 for example includes a semiconductor material like amorphous silicon, but is not limited thereto. Precisely speaking, the formations of the dielectric layer 152, the barrier layer 154, and the mask layer 156 include but not limited to the following steps. Firstly, a plurality of deposition processes is performed on the substrate 100, to form a dielectric material layer (not shown in the drawings), a barrier material layer (not shown in the drawings), and a mask material layer (not shown in the drawings) conformally covering the top surfaces of the stack layer structure 130 and the inner surfaces of the through holes 142. Then, an etching back process is performed, to remove the mask material layer, the barrier material layer, and the dielectric material layer disposed on the top surfaces of the stack layer structure 130 and on the bottom surfaces of the through holes 142, thereby partially exposing each of the metal-oxide patterns 126 underneath. Accordingly, the dielectric layer 152 and the barrier layer 154 will respectively obtain a L-shaped cross-section, with the dielectric layer 152 and the barrier layer 154 being sequentially stacked on the sidewalls of each of the through holes 142, and the mask layer 156 is disposed on the barrier layer 154 and includes an I-shaped cross-section.

Figure 9:
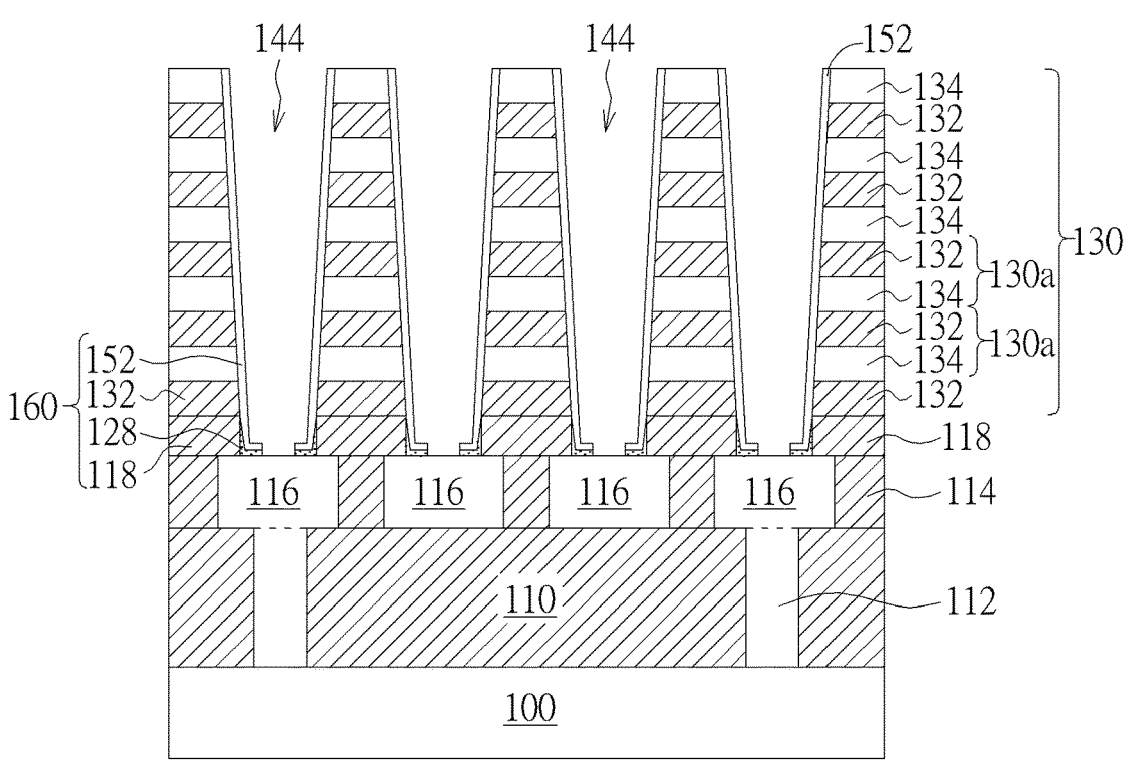

As shown in FIG. 9, the mask layer 156 and the barrier layer 154 are completely removed to expose the dielectric layer 152, and the metal-oxide patterns 126 shown in FIG. 8 are then patterned through the dielectric layer 152, to form a plurality of dielectric layers 128. Meanwhile, a plurality of through holes 144 is formed, with the top surface of each of the conductive pads 116 underneath being partially exposed from the dielectric layer 152 and the dielectric layers 128. The through holes 144 penetrates through the stack layer structure 130 and each of the metal-oxide patterns 124 as shown in FIG. 8 respectively, and each of the dielectric layers 128 will therefore obtains a L-shaped cross-section correspondingly, at the bottom of each of the through holes 144. Precisely speaking, each of the dielectric layers 128 is sandwiched between the dielectric layers 152 and the dielectric layer 118 which have different materials from each other. The horizontal portion of each dielectric layer 128 and the horizontal portion of the dielectric layer 152 have inner sidewalls which are vertically aligned with each other, and the vertical portion of each dielectric layer 128 has an inner sidewall vertical aligned with the sidewall of the dielectric layer 132. With these arrangements, the dielectric layer 152, the dielectric layer 128, the dielectric layer 132 and the dielectric layer 118 together form a second insulating layer 160 surrounding at the bottom of each of the through holes 144, wherein the dielectric layer 152 physically contact the dielectric layer 132 and the dielectric layer 128 at the same time, and the dielectric layer 128 is enclosed by the dielectric layer 152, the dielectric layer 118, and the conductive pads 116 as shown in FIG. 9. It is noted that, the dielectric layer 152 (including a high-k dielectric material), the dielectric layer 128 (including a metal-oxide material), and the dielectric layer 132 (including a dielectric material the same as that of the first insulating layer 114) all include different materials, which enables to gain better insulating performances.

Figure 10:
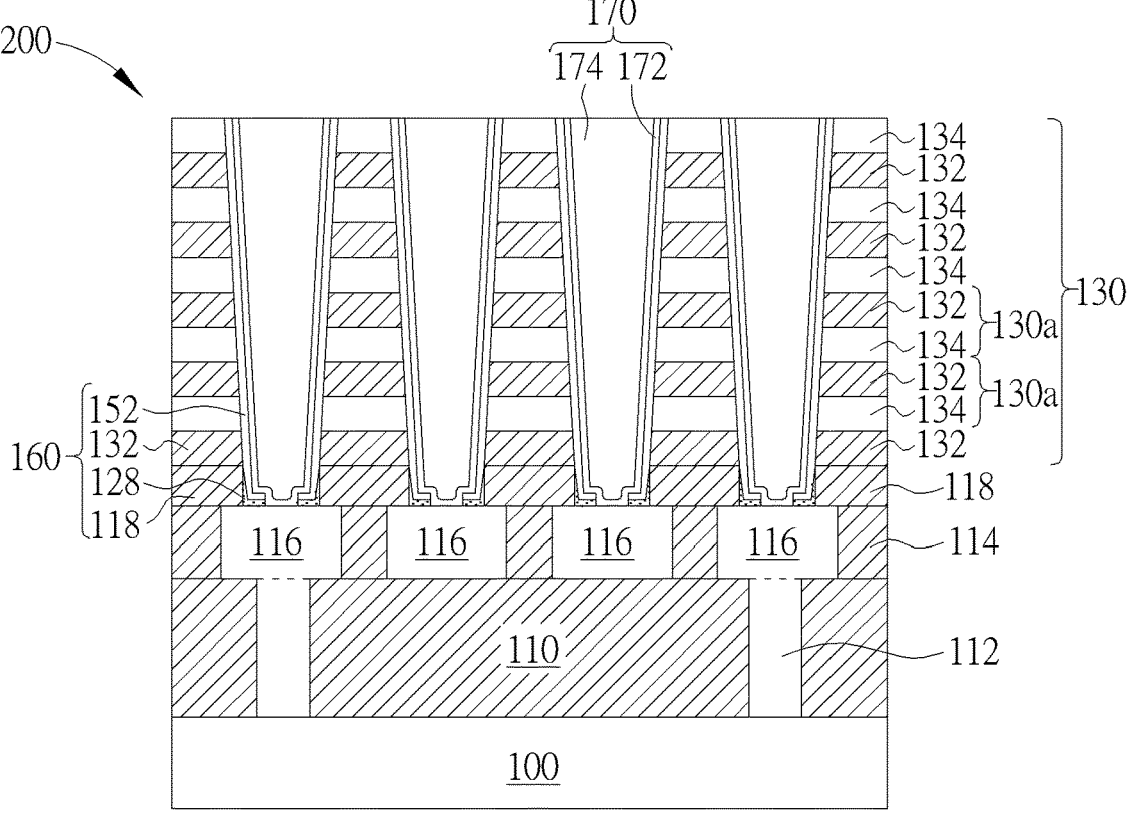

Following these, as shown in FIG. 10, a plurality of conductive columns 170 is formed on the substrate 100, respectively disposed in each of the through holes 144 to electrically connect to each of the conductive pads 116. Each of the conductive columns 170 is separately disposed in the stack layer structure 130 and the second insulating layer 160, and includes a barrier layer 172 and a conductive layer 174 stacked on one over another. In one embodiment, the barrier layer 172 for example includes titanium, tantalum, titanium nitride or tantalum nitride, and the conductive layer 174 includes a metal material like aluminum, titanium, tantalum, tungsten or copper, but is not limited thereto. The formation of the conductive columns 170 includes but not limited to the following steps. Firstly, a deposition process is performed to form a barrier material layer (not shown in the drawings) conformally covering the dielectric layer 152, the dielectric layers 128, and the conductive pads 116, and a conductive material layer (not shown in the drawings) is formed to at least fill in the rest space of the through holes 144 as shown in FIG. 9. After that, a planarization process is performed to partially remove the conductive material layer and the barrier material layer, to form the conductive columns 170. Then, a bottom surface of each of the conductive columns 170 is coplanar with a bottom surface of the dielectric layer 128, to physically contact each of the conductive pads 116.

Through these performances, the fabrication of the semiconductor device 200 in the first embodiment is accomplished. According to the semiconductor device 200 of the present embodiment, the conductive columns 170 are separately disposed in the second insulating layer 160, to electrically connect to each of the conductive pads 116. The second insulating layer 160 is formed by stacking the dielectric layer 152, the dielectric layer 128, the dielectric layer 132, and the dielectric layer 118 with different materials, and has a composite structure which enables to effectively avoid the short circuit issue at the bottom of each through hole 144 caused by excessively lateral etching. Thus, the device reliability and performance of the semiconductor device 200 is further improved thereby.

On the other hand, according to the fabricating method of the present embodiment, the metal-oxide material layer 120 having a significant etching selectivity relative to the dielectric material is additionally formed between the stack layer structure 130 and the conductive pads 116, and which is etched through a two-stepped etching process such as a wet etching process or a dry etching process, to form the dielectric layers 128 with each of them having a L-shaped cross-section. The dielectric layers 128 include a metal-oxide material having a significant etching selectivity relative to the first insulating layer 114, for example including aluminum oxide. In this way, through the arrangement of the dielectric layers 128, the short-circuit issue usually occurred at the bottom of the conductive columns 170 due to excessively lateral etching while forming the through holes 144 will be effective avoid. Also, it is noted that, according to the influence of the wet etching process, the extension area of the dielectric layers 128 in the horizontal direction is obviously smaller than that in the vertical direction, as well as the extension area of each of the conductive pads 116 in the horizontal direction. Thus, the arrangement of the dielectric layers 128 is allowable to isolate each of the conductive columns 170 at the bottom, and to improve the possible short-circuit issues thereby. The semiconductor device 200 obtained in the present embodiment will therefore have optimized device reliability and performance.

People well known in the arts should easily realize the semiconductor device and the fabricating method thereof in the present disclosure is not limited to the aforementioned embodiment, and may further include other examples or variety. The following description will detail the different embodiments of the semiconductor device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figures 11, 12:
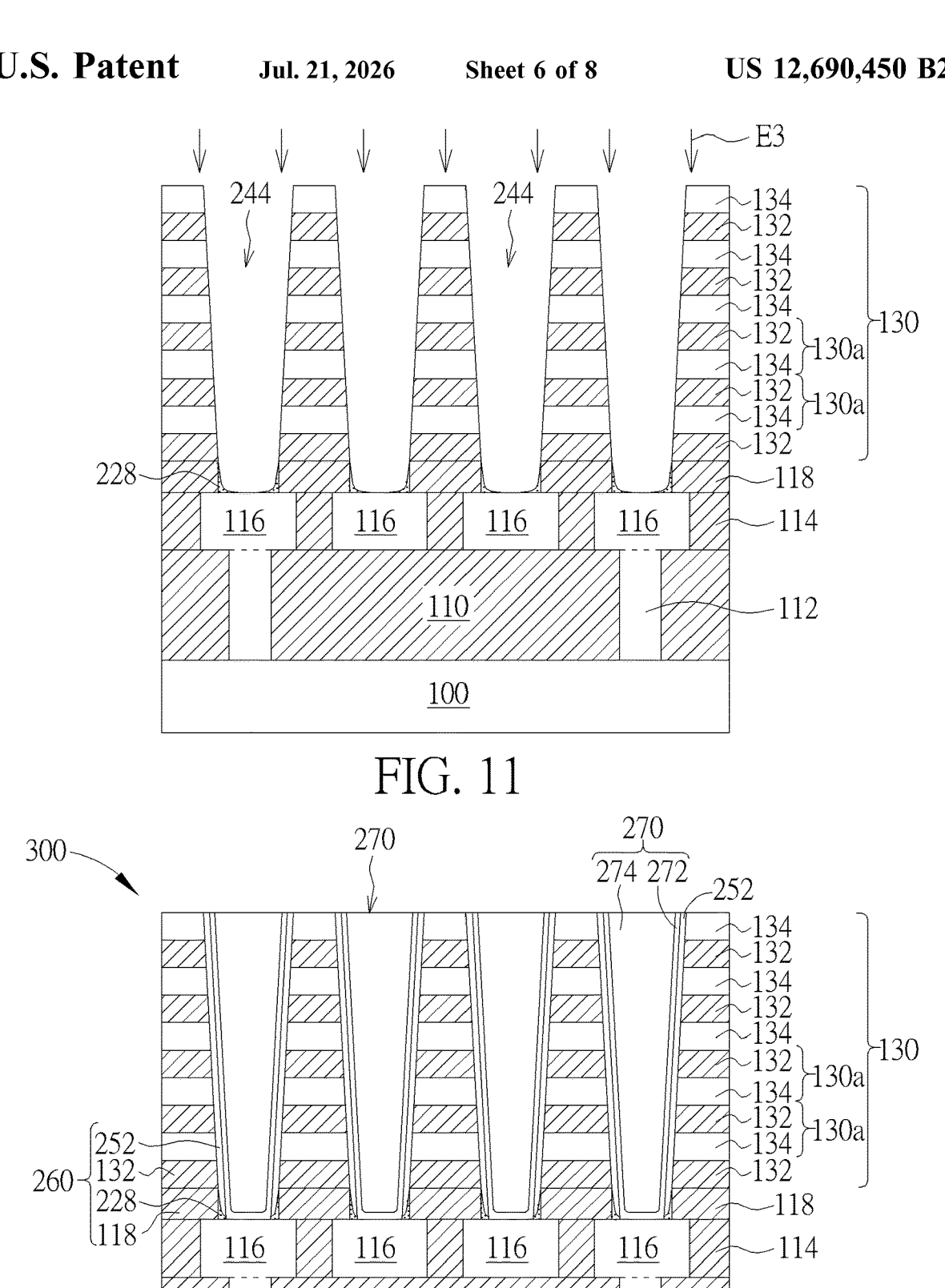

Please refer to FIG. 11 to FIG. 12, which are schematic diagrams of a semiconductor device 300 according to the second embodiment in the present disclosure. The forming processes of the fabricating method in the present embodiment are substantially the same as those of the fabricating method in the aforementioned first embodiment, as shown in FIG. 1 to FIG. 6, and all the similarities will not be redundantly described herein after. The difference between the present embodiment and the aforementioned first embodiment is in that after performing the etching process E1, an etching process E3 such as a wet etching process is performed, to further etch the metal-oxide patterns 124 to form a plurality of through holes 244 and a plurality of dielectric layers 228.

Precisely speaking, as shown in FIG. 11, each of the metal-oxide patterns 124 shown in FIG. 6 is etched both along a vertical direction and a lateral direction through the etching process E3, to further thin down the thickness of the metal-oxide patterns 124 in an overall manner till exposing each of the conductive pads 116 underneath. Then, the dielectric layers 228 is formed accordingly, with each of the dielectric layers 228 having an extension area in the horizontal direction being obviously smaller than that in the vertical direction, to present in a narrow top and a wide bottom cross-section at the bottom of each of the through holes 244.

After that, as shown in FIG. 12, a dielectric layer 252 having a high-k dielectric material, a barrier layer 272, and a conductive layer 274 having a metal material are sequentially formed in each through hole 244, with the dielectric layer 252 only covering two opposite sidewalls of each through hole 244, with the barrier layer 272 conformally covering the dielectric layer 252, the dielectric layer 228 and the conductive pads 116, and with the conductive layer 274 filling in the rest space of each through hole 244 shown in FIG. 11. Then, the barrier layer 272 and the conductive layer 274 together form a plurality of conductive columns 270.

Through these performances, the fabrication of the semiconductor device 300 in the second embodiment is accomplished. According to the fabricating method of the semiconductor device 300 in the present embodiment, the dielectric layers 228 are formed directly through performing the etching process E3. Thus, the fabrication of the present embodiment is allowable to omit the formations of the barrier layer 154 and the mask layer 156 in the aforementioned embodiment, thereby forming the semiconductor device 300 having an optimized device reliability and performances under a simplified process flow.

On the other hand, according to the semiconductor device 300 of the present embodiment, the dielectric layer 228 (including a metal-oxide material) is additionally disposed between the dielectric layer 252 (including a high-k dielectric material) and the dielectric layer 118 (including a dielectric material the same as that of the insulating layer 114) which have different materials, wherein the horizontal portion of each dielectric layer 228 and the horizontal portion of the dielectric layer 252 also have vertical aligned inner sidewalls, and the bottom surface of the dielectric layer 228 is also coplanar with the bottom surface of each conductive column 270. With these arrangements, the dielectric layer 252, the dielectric layer 228, the dielectric layer 132 and the dielectric layer 118 stacked in sequence will together form a second insulating layer 260 surrounding at the bottom of each of the conductive columns 270, with the dielectric layer 252 physically contacting the dielectric layer 132 and the dielectric layer 228 at the same time to provide better insulating performances, and with the dielectric layer 228 physically contacting the dielectric layer 118, the dielectric layer 252 and the conductive pads 116 at the same time to be enclosed thereby. Thus, the second insulating layer 260 in the present embodiment also includes a composite structure, which enables to effectively avoid the possible short circuit issue at the bottom of each conductive column 270 caused by excessively lateral etching, thereby improving the device reliability and performance of the semiconductor device 300.

Figures 13, 14:
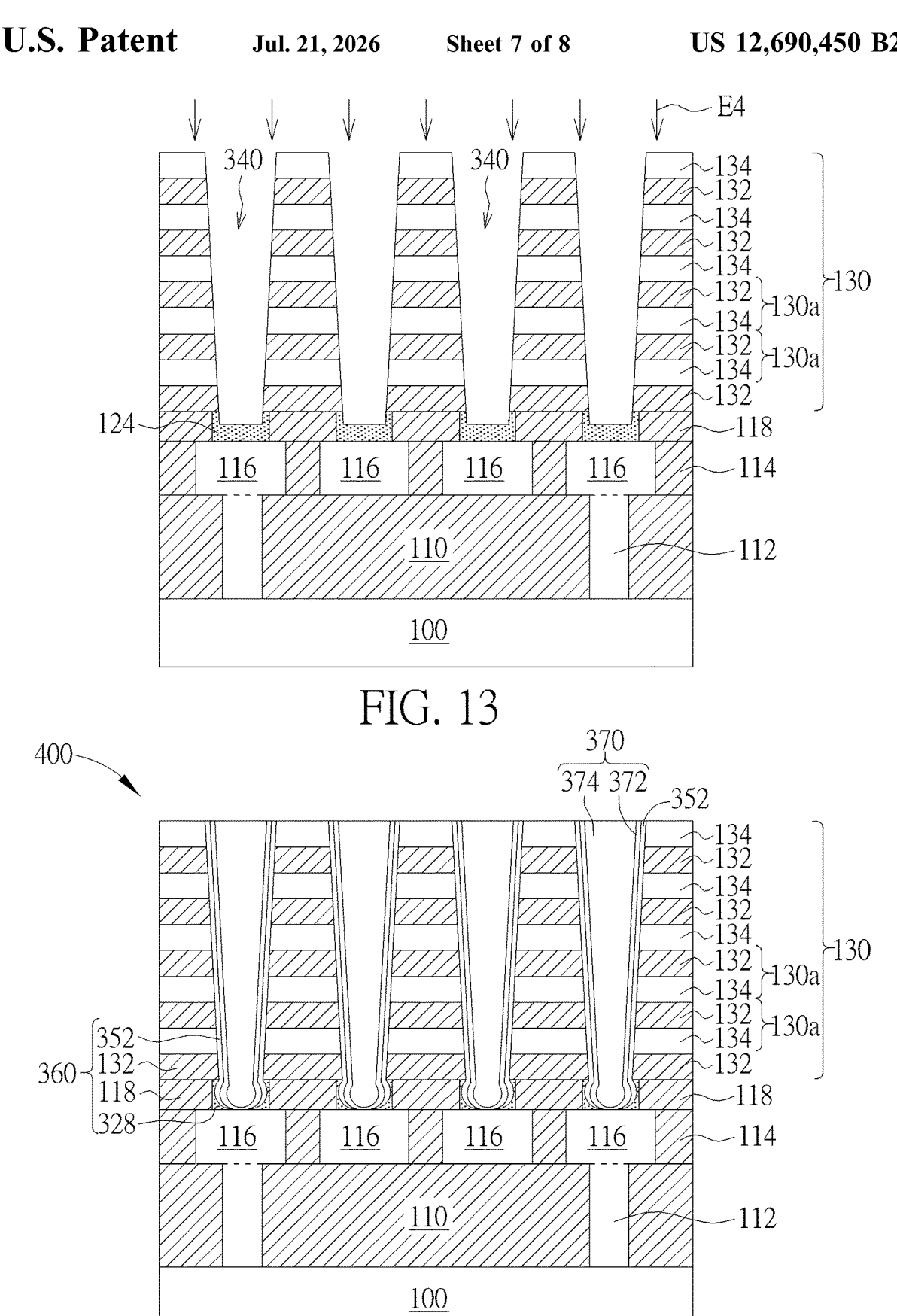

Please refer to FIG. 13 to FIG. 14, which are schematic diagrams of a semiconductor device 400 according to the third embodiment in the present disclosure. The forming processes of the fabricating method in the present embodiment are substantially the same as those of the fabricating method in the aforementioned first embodiment, as shown in FIG. 1 to FIG. 5, and all the similarities will not be redundantly described herein after. The difference between the present embodiment and the aforementioned first embodiment is in that after performing an etching process E4 such as a wet etching process, to form a plurality of through holes (not shown in the drawings) each including significant lateral expansion in the dielectric layer 328.

Precisely speaking, the etching process E4 such as a dry etching process is firstly performed, to vertically etch the dielectric layers 132, the conductive layer 134 and a portion of the metal-oxide patterns 124 shown in FIG. 5, to form a plurality of through holes 340 penetrating through the stack layer structure 130 and the portion of the metal-oxide patterns 124, as shown in FIG. 13. Then, the wet etching process is performed to etch the metal-oxide patterns 124 as shown in FIG. 13 both along the vertical direction and the lateral direction the same time, with the etching condition of laterally etching the metal-oxide patterns 124 being strengthened to form a dielectric layer 328. With these performances, the through holes formed accordingly will have an expansion profile at both sides in the dielectric layer 328, without laterally penetrating the dielectric layer 328. Thus, the dielectric layer 328 may therefore obtain a gyro-shaped recess or a dish-shaped recess disposed therein, as shown in FIG. 14.

Following these, as shown in FIG. 14, a dielectric layer 352 having a high-k dielectric material, a barrier layer 372, and a conductive layer 374 having a metal material are sequentially formed in each of the through holes, with the dielectric layer 352 only covering two opposite sidewalls of each through hole, with the barrier layer 372 conformally covering the dielectric layer 352, the dielectric layer 328 and the conductive pads 116, and with the conductive layer 374 filling in the rest space of each through hole. The barrier layer 372 and the conductive layer 374 together form a plurality of conductive columns 370. In this way, each of the conductive columns 370 will correspondingly include a gyro-shaped structure or a dish-shaped structure, as shown in FIG. 14.

Through these performances, the fabrication of the semiconductor device 400 in the third embodiment is accomplished. According to the fabricating method of the semiconductor device 400 in the present embodiment, the conditions of laterally etching the metal-oxide patterns 124 is strengthen while performing the wet etching process, to form the through holes having an expanded recess at both two sides in the dielectric layer 328, thereby forming a gyro-shaped recess or a dish-shaped recess in the dielectric layer 328. Thus, the fabrication of the present embodiment is also allowable to form the semiconductor device 400 having an optimized device reliability and performance under a simplified process flow.

On the other hand, according to the semiconductor device 400 of the present embodiment, the dielectric layer 328 (including a metal-oxide material) is additionally disposed between the dielectric layer 352 (including a high-k dielectric material) and the dielectric layer 118 (including a dielectric material the same as that of the insulating layer 114) which have different materials. The dielectric layer 328 has the gyro-shaped recess or the dish-shaped recess disposed thereon, with the bottom surface of the dielectric layer 328 also being coplanar with the bottom surface of the conductive columns 370, and the dielectric layer 352 conformally covers the recess on the dielectric layer 328. With these arrangements, the dielectric layer 352, the dielectric layer 328, the dielectric layer 132, and the dielectric layer

118 stacked on one over another together form a second insulating layer 360, surrounding at the bottom of each of the conductive columns 370, with the dielectric layer 352 physically contacting the dielectric layer 132 and the dielectric layer 328 at the same time, and with the dielectric layer 328 physically contacting the dielectric layer 118, the dielectric layer 352 and the conductive pads 116 to be enclosed thereby. Then, the second insulating layer 360 enables to gain better insulating performances. Thus, the second insulating layer 360 in the present embodiment also includes a composite structure, which enables to effectively avoid the possible short circuit issue at the bottom of each conductive column 370 caused by excessively lateral etching, thereby improving the device reliability and performance of the semiconductor device 400.

In overall speaking, through the fabrication method of the present disclosure, a dielectric layer with a significant etching selectivity (for example including a metal-oxide material) is additionally disposed at the bottom of the through holes, to avoid excessively etching the bottoms of the through holes in the lateral direction, during the subsequent etching process such as the wet etching process. Then, the conductive columns formed subsequently in the through holes will therefore obtain more reliable structure and performances, to prevent from the short-circuit issues. According to the semiconductor device of the present disclosure, a dielectric layer (for example including a metal-oxide material) is additionally disposed at the bottom of each conductive column, and the dielectric layer is further etched during the wet etching process to obtain a L-shaped cross-section, or a gyro-shaped recess or a dish-shaped recess. Accordingly, the dielectric is disposed at two opposite sidewalls of each conductive column, for further isolating each of the conductive columns especially at the bottom thereof, and effectively preventing from the possible short-circuit issues.

Figure 15:
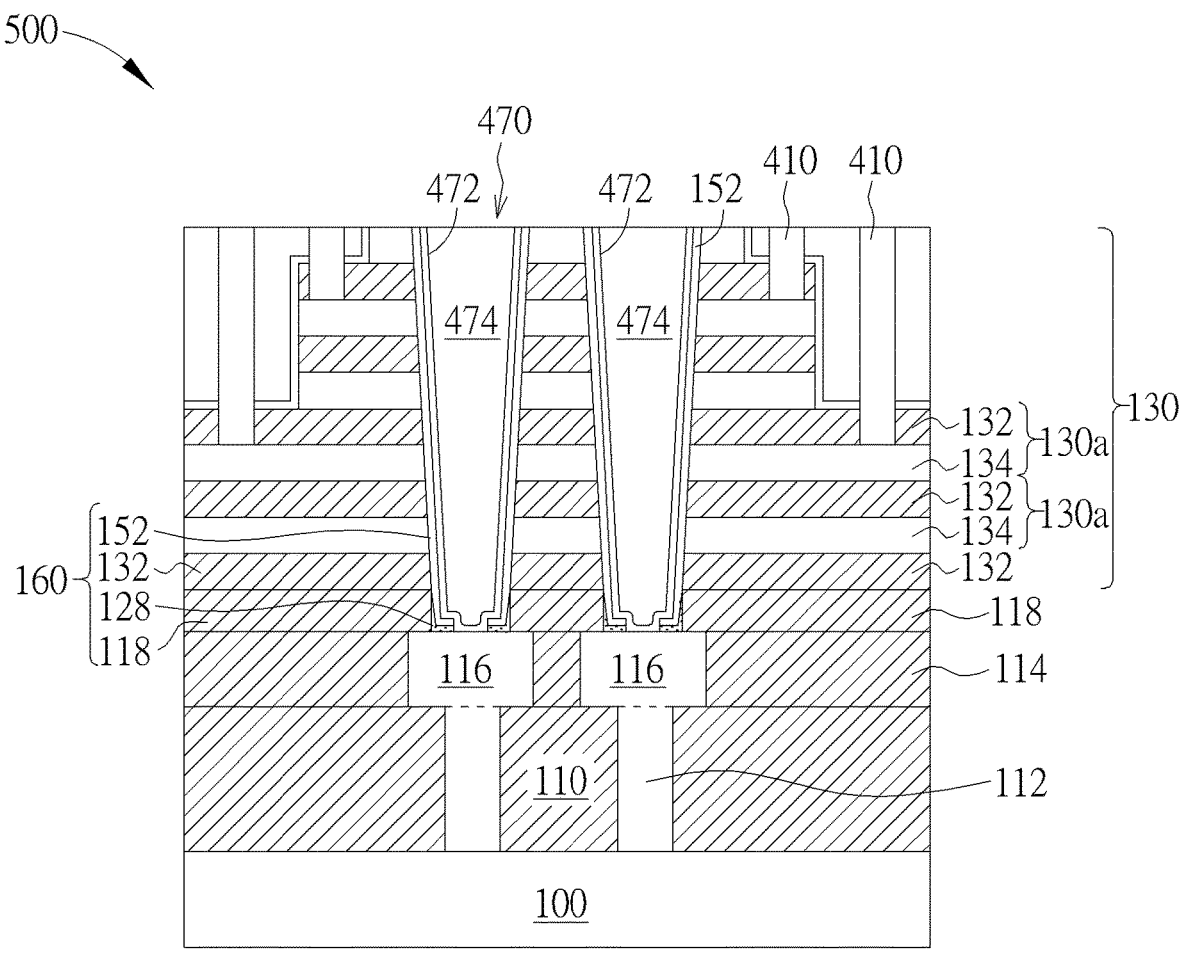
FIG. 15 is a schematic diagram illustrating a semiconductor device according to a preferable embodiment in the present disclosure.

The semiconductor device and/or the fabrication method thereof enable to be applied on forming a vertically columnar semiconductor structure, such as a conductive column or a plug, for improving the structural reliability and performances thereby. Please refers to FIG. 15, which is a schematic diagram of a semiconductor device 500 according to a preferably embodiment in the present disclosure. In the present embodiment, the semiconductor device for example includes a three-dimensional NAND memory device 500 including the substrate 100, the stack layer structure 130 disposed on the substrate 100, and a plurality of channel structures 470 penetrating through the stack structure 130, wherein the stack structure 130 is configured as a memory stack structure to fan-out each layer of word lines (namely, the conductive layers 134) for electrically connecting to a word line contact 410 via a staircase structure disposed at both two sides of the stack layer structure 130.

Precisely speaking, each of the channel structures 470 includes a columnar structure, to electrically connect to each of the conductive pads 116 disposed within the first insulating layer 114, respectively. The channel structures 470 individually includes a dielectric layer 152 disposed along the sidewalls of the through holes (not shown in the drawings), a channel layer 472 and a filling layer 474 filled in the rest space of the through holes. The channel layer 472 for example includes a semiconductor material like polysilicon, and the filling layer 474 for example includes an isolating material like silicon oxide. Accordingly, the channel structures 470, the conductive layers 134 and the conductive pads 116 will together form transistors, with each conductive pad 116 serving as a source/drain electrode, with the intersection of each channel structure 470 and each conductive layer 134 serving as a memory cell, and with each conductive layer 134 serving as a word line for controlling the writing and reading of data in each memory cell.

It is noted that, the dielectric layer 128 is additionally disposed at the bottom of each of the channel structures 470, and which is sandwiched between the dielectric layer 152 and the dielectric layer 118, to obtain a L-shaped cross-section. The dielectric layer 128 also includes a metal-oxide material with a significant etching selectivity relative to other dielectric materials, to improve the short-circuit issues usually occurred during the formation of the through holes. Also, in the present embodiment, the dielectric layer 152, the dielectric layer 128, the dielectric layer 132 and the dielectric layer 118 stacked on one over another together form the second insulating layer 160, surrounding at the bottom of each of the channel structures 470, with the dielectric layer 152 physically contacting the dielectric layer 132 and the dielectric layer 128 at the same time to provide better insulating performances. In this way, the three-dimensional NAND memory device 500 of the present embodiment enables to obtain a more reliable structure and performances, thereby avoiding the short-circuit issues. It is noted that, other components or detailed structures of the three-dimensional NAND memory device 500 in the present embodiment are all substantially the same as those in the aforementioned first embodiment, and will not be redundantly described hereinafter.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a stack layer structure, disposed on the substrate and comprising a plurality of dielectric layers and a plurality of conductive layers alternately stacked with each other;
a plurality of conductive pads, separately disposed in a first insulating layer and disposed over the substrate; and
a plurality of conductive columns, separately disposed in the stack layer structure and a second insulating layer, the conductive columns respectively contacting each of the conductive pads, and the second insulating layer comprising a first dielectric layer, a second dielectric layer and a third dielectric layer stacked on sidewalls of each of the conductive columns, wherein the second dielectric layer physically contacts the first dielectric layer, the conductive pads and the third dielectric layer at the same time, and the stack layer structure directly contacts a sidewall of the first dielectric layer.

2. The semiconductor device according to claim 1, wherein a bottom surface of the second dielectric layer and a bottom surface of the conductive columns are coplanar with each other.

3. The semiconductor device according to claim 1, wherein the second dielectric layer is sandwiched between the first dielectric layer and the third dielectric layer.

4. The semiconductor device according to claim 1, wherein the second dielectric layer is enclosed by the first dielectric layer, the conductive pads and the third dielectric layer.

5. The semiconductor device according to claim 1, wherein the second insulating layer further comprises a fourth dielectric layer stacked on the third dielectric layer, and an inner sidewall of the second dielectric layer is vertically aligned with a sidewall of the fourth dielectric layer.

6. The semiconductor device according to claim 1, wherein an extension area of the second dielectric layer in a horizontal direction is smaller than an extension area of each of the conductive pads in the horizontal direction.

7. The semiconductor device according to claim 1, wherein materials of the third dielectric layer, the second dielectric layer and the first dielectric layer are all different from each other, the first dielectric layer comprises a high-k dielectric material, and the material of the third dielectric layer is the same as a material of the first insulating layer.

8. The semiconductor device according to claim 7, wherein the second dielectric layer comprises a metal-oxide material.

9. The semiconductor device according to claim 5, wherein the second dielectric layer and the first dielectric layer respectively comprises a L-shape cross-section, and a horizontal portion of the L-shape cross-section of the first dielectric layer and a horizontal portion of the L-shape cross-section of the second dielectric layer both comprise inner sidewalls being vertically aligned with each other.

10. The semiconductor device according to claim 9, wherein the L-shape cross-section of the first dielectric layer comprises a vertical portion being vertically aligned with a sidewall of the fourth dielectric layer.

11. The semiconductor device according to claim 1, wherein the second dielectric layer comprises a gyro-shaped recess or a dish-shaped recess, and the first dielectric layer conformally covers the gyro-shaped recess or a dish-shaped recess of the second dielectric layer.

12. A semiconductor device, comprising:
a substrate;
a first insulating layer, a second insulating layer, and a stack layer structure respectively disposed on the substrate from bottom to top, wherein the stack layer structure comprising a plurality of dielectric layers and a plurality of conductive layers alternately stacked with each other;
a plurality of conductive pads, separately disposed in the first insulating layer;
a plurality of conductive columns, separately disposed in the stack layer structure and in second insulating layer, the conductive columns respectively contacting the conductive pads;
a first dielectric layer disposed between the conductive columns and the second insulating layer, wherein a bottom surface of the first dielectric layer is coplanar with a bottom surface of the second insulating layer, and the bottom surface of the second insulating layer directly contacts top surfaces of the contact pads and the first insulating layer; and
a second dielectric layer disposed between the stack layer structure and the conductive columns, and between the first dielectric layer and the conductive columns.

13. The semiconductor device according to claim 12, wherein a top surface of the first dielectric layer is not higher than the top surface of the second insulating layer.

14. The semiconductor device according to claim 12, wherein the first dielectric layer comprises a L-shaped cross-section.

15. A semiconductor device, comprising:
a substrate; and
a plurality of conductive columns, separately disposed in an insulating layer, and disposed over the substrate;

wherein the insulating layer comprising a first dielectric layer, a second dielectric layer and a third dielectric layer stacked on sidewalls of each of the conductive columns;

wherein, the second dielectric layer and the first dielectric layer respectively comprises a L-shape cross-section, and a horizontal portion of the L-shape cross-section of the first dielectric layer and a horizontal portion of the L-shape cross-section of the second dielectric layer both comprise inner sidewalls being vertically aligned with each other.

\*  \*  \*  \*  \*